(12) United States Patent
Hara (10) Patent No.: US 7,663,254 B2
(45) Date of Patent: Feb. 16, 2010

(54) SEMICONDUCTOR APPARATUS AND METHOD OF MANUFACTURING THE SAME

(75) Inventor: Toshiyuki Hara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 16 days.

(21) Appl. No.: 12/219,053

(22) Filed: Jul. 15, 2008

(65) Prior Publication Data
US 2009/0051047 A1 Feb. 26, 2009

(30) Foreign Application Priority Data
Aug. 21, 2007 (JP) ............... 2007-214306

(51) Int. Cl.
*H01L 23/29* (2006.01)
(52) U.S. Cl. .................. 257/790; 257/787; 438/127
(58) Field of Classification Search ............... 257/790, 257/787, 778; 438/112, 124, 126, 127, 108
See application file for complete search history.

(56) References Cited

U.S. PATENT DOCUMENTS

| 5,864,178 | A | * | 1/1999 | Yamada et al. | ............... | 257/737 |
| 6,093,972 | A | * | 7/2000 | Carney et al. | ............... | 257/790 |
| 6,144,107 | A | * | 11/2000 | Narita | ............... | 257/789 |
| 6,224,711 | B1 | * | 5/2001 | Carden et al. | ............... | 156/311 |
| 6,265,768 | B1 | * | 7/2001 | Su et al. | ............... | 257/684 |
| 6,265,784 | B1 | * | 7/2001 | Kawano et al. | ............... | 257/788 |
| 6,407,461 | B1 | * | 6/2002 | Farquhar et al. | ............... | 257/787 |
| 6,661,104 | B2 | * | 12/2003 | Jiang et al. | ............... | 257/789 |
| 7,274,110 | B2 | * | 9/2007 | Meyer et al. | ............... | 257/790 |
| 7,417,330 | B2 | * | 8/2008 | Wakabayashi et al. | ...... | 257/790 |
| 2004/0150118 | A1 | | 8/2004 | Honda | | |
| 2009/0197370 | A1 | * | 8/2009 | Katsura et al. | ............... | 438/108 |

FOREIGN PATENT DOCUMENTS

| JP | 2000-200870 | 7/2000 |
| JP | 2000-315698 | 11/2000 |
| JP | 2004-260138 | 9/2004 |

* cited by examiner

*Primary Examiner*—S. V Clark
(74) *Attorney, Agent, or Firm*—McGinn IP Law Group, PLLC (57) ABSTRACT

There is provided a semiconductor apparatus which includes a substrate, a semiconductor chip mounted above the substrate, a first resin filled between the substrate and the semiconductor chip, and a second resin formed on the substrate and extending from a side surface of the semiconductor chip toward an outer edge of the substrate. The second resin extends from an intersection of an extension of the side surface of the semiconductor chip and the substrate toward the outer edge of the substrate so that a first stress generated on a contact surface between the first resin and the semiconductor chip and a second stress generated on a contact surface between the first resin or the second resin and the substrate balance out each other.

15 Claims, 8 Drawing Sheets

SEMICONDUCTOR APPARATUS AND METHOD OF MANUFACTURING THE SAME

BACKGROUND OF THE INVENTION

1. Field of the Invention

The present invention relates to a semiconductor apparatus in which a semiconductor chip is mounted on a substrate and a method of manufacturing the same.

2. Description of Related Art

A flip-chip ball grid array (FCBGA) has been known which electrically connects a semiconductor chip and a substrate where the semiconductor chip is mounted by a solder bump. In FCBGA, at reflow process (thermal treatment) for connecting the semiconductor chip and the substrate by a solder bump, a stress is generated between a semiconductor chip and a substrate, because they have different coefficients of thermal expansion. In FCBGA, the stress causes distortion. As a result, in FCBGA of a related art, bad soldering connection is likely to occur in a warped part at the time of mounting onto a circuit board. A semiconductor apparatus for reducing a stress which is generated due to a difference in coefficient of thermal expansion is disclosed in Japanese Unexamined Patent Application Publication No. 2004-260138, for example.

Figure 6:
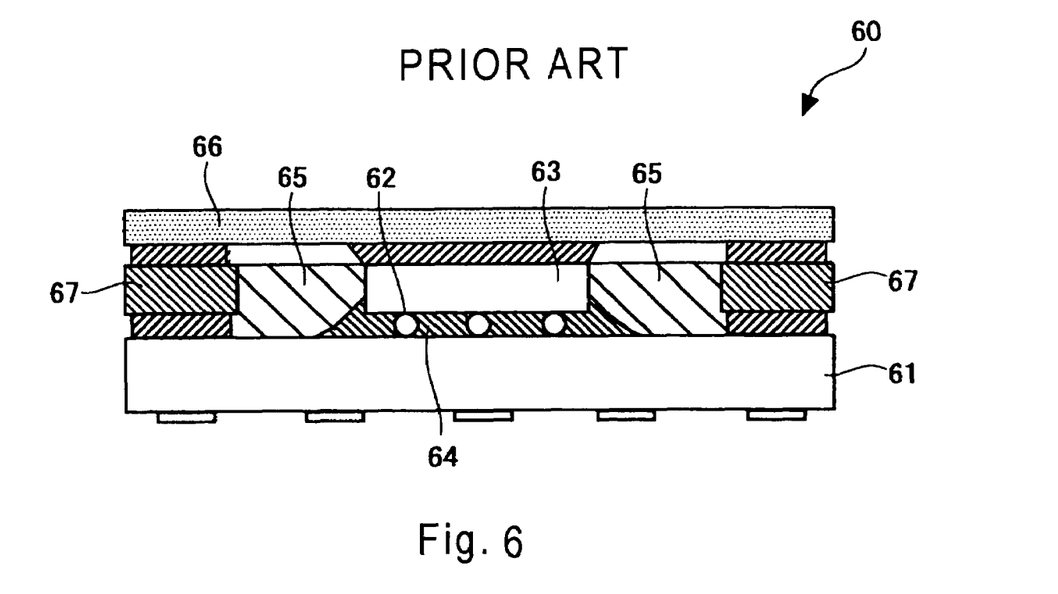
FIG. 6 is a view showing a semiconductor apparatus 60 disclosed in Japanese Unexamined Patent Application Publication No. 2004-260138.

FIG. 6 shows a semiconductor apparatus 60 according to Japanese Unexamined Patent Application Publication No. 2004-260138. In the semiconductor apparatus 60, a semiconductor chip 63 is connected by flip-chip bonding onto a mounting substrate 61 with bump electrodes 62 interposed therebetween. A first resin 64 having a high coefficient of thermal expansion is formed in the space which is between the substrate 61 and the semiconductor chip 63. A second resin 65 having a lower coefficient of thermal expansion than the first resin 64 is formed in the space which is on the substrate 61 and surrounded by a covering portion 66 and the side surfaces of a reinforcing member 67 and the semiconductor chip 63.

In the semiconductor apparatus 60, a stress due to a difference in coefficient of thermal expansion between the semiconductor chip 63 and the substrate 61 is reduced by filling a resin having a high coefficient of thermal expansion between the semiconductor chip 63 and the substrate 61. Further, a shrinkage or expansion stress of the first resin 64 due to a temperature change is reduced by setting the coefficient of thermal expansion of the second resin 65 to be smaller than that of the first resin 64.

Japanese Unexamined Patent Application Publication No. 2000-200870 discloses a semiconductor apparatus in which a semiconductor chip is connected by flip-chip bonding onto a substrate with eutectic solders interposed therebetween. In this semiconductor apparatus, a resin is formed between the substrate and the semiconductor chip and in the vicinity of the outer edge of the semiconductor chip.

Japanese Unexamined Patent Application Publication No. 2000-315698 discloses a semiconductor package in which a resin is injected onto a substrate where a semiconductor package is mounted by flip-chip bonding by means of transfer molding.

Figure 7A:
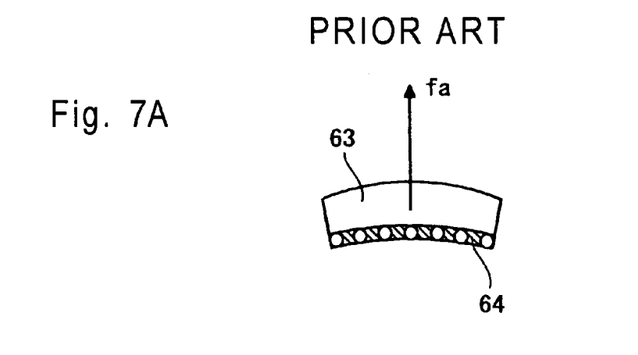
FIGS. 7A to 7C are views showing stresses applied to a semiconductor chip and a substrate where the semiconductor chip is mounted in the semiconductor apparatus disclosed in Japanese Unexamined Patent Application Publication No. 2004-260138.
Figure 7B:
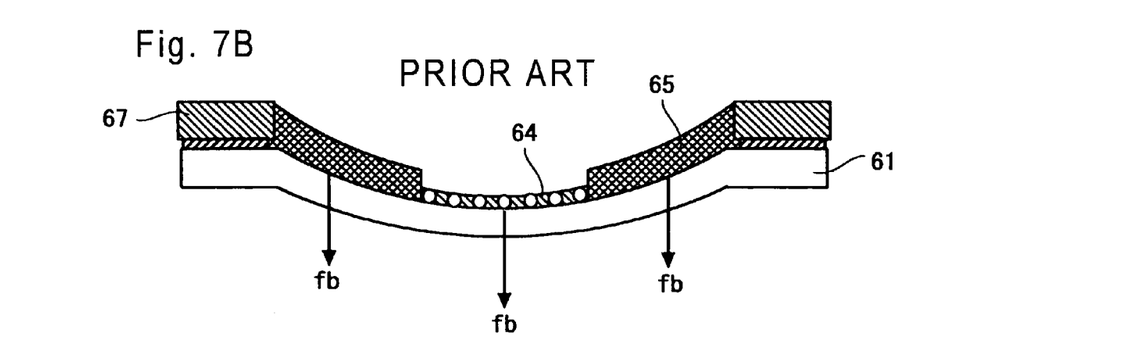
Figure 7C:
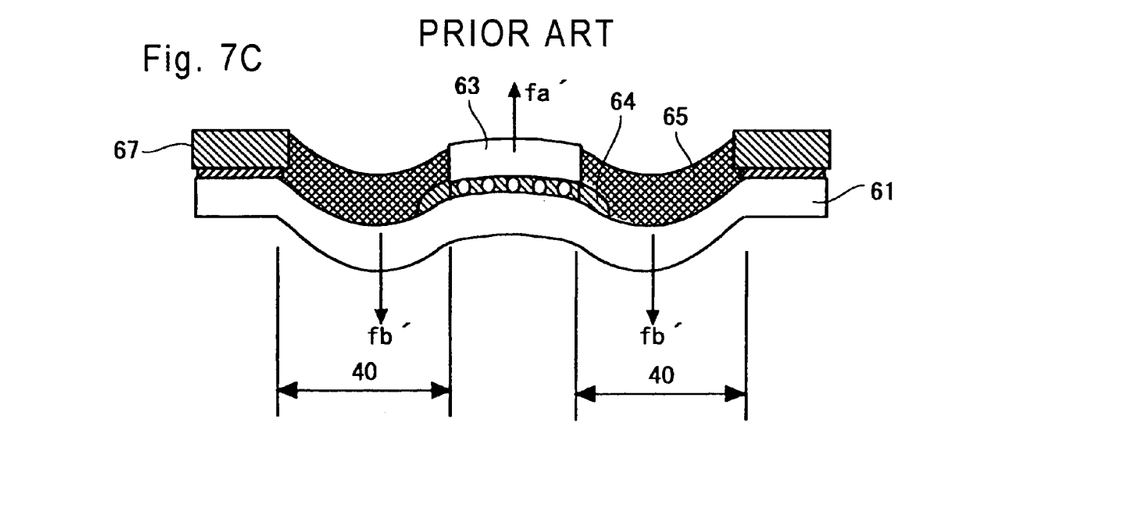

However, in Japanese Unexamined Patent Application Publication No. 2004-260138, it is difficult to sufficiently prevent warpage caused by stresses on the semiconductor chip 63 and the substrate 61 where the semiconductor chip 63 is mounted. FIGS. 7A to 7C show stresses applied to the substrate 61 and the semiconductor chip 63, respectively. A stress fa is generated perpendicularly (upward in FIG. 7A) to the plane of the semiconductor chip 63. A stress fb is generated perpendicularly (downward in FIG. 7B) to the plane of the substrate 61, in the opposite direction to the stress fa. In this case, a combined stress fa' which is a difference between the stress fa and the stress fb is generated perpendicularly (upward in FIG. 7C) to the plane of the semiconductor chip 63. A stress fb' which is generated perpendicularly (downward in FIG. 7C) remains in an area 40 that is not affected by the stress fa. Accordingly, the stresses fa' and fb' are applied onto the semiconductor chip 63 and the substrate 61, respectively.

The semiconductor apparatus 60 is thereby distorted (FIG. 7C). Because of no consideration about balancing out a stress applied to the semiconductor chip 63 and a stress applied to the substrate 61 in the semiconductor apparatus 60, it is difficult to sufficiently prevent distortion of the semiconductor apparatus 60 as a whole. Specifically, if the second resin 65 is formed simply to fill the entire space surrounded by the side surfaces of the reinforcing member 67 and the semiconductor chip 63, the stresses do not balance out, thus failing to sufficiently prevent distortion of the semiconductor apparatus 60 as a whole.

Japanese Unexamined Patent Application Publication Nos. 2000-200870 and 2000-315698 do not address prevention of distortion of a semiconductor chip and a substrate caused by stresses.

Therefore, it has been difficult to sufficiently prevent distortion of a semiconductor chip and a substrate where the semiconductor chip is mounted which is caused by stresses in the semiconductor apparatus of related arts.

SUMMARY

According to an embodiment of the present invention, there is provided a semiconductor apparatus which includes a substrate, a semiconductor chip mounted above the substrate, a first resin filled between the substrate and the semiconductor chip, and a second resin formed on the substrate and extending from a side surface of the semiconductor chip toward an outer edge of the substrate, wherein the second resin extends from an intersection of an extension of the side surface of the semiconductor chip and the substrate toward the outer edge of the substrate so that a first stress generated on a contact surface between the first resin and the semiconductor chip and a second stress generated on a contact surface between the first resin or the second resin and the substrate balance out each other.

According to another embodiment of the present invention, there is provided a method of manufacturing a semiconductor apparatus, which includes mounting a semiconductor chip above a substrate filling a first resin between the substrate and the semiconductor chip, and forming a second resin extending from an intersection of an extension of a side surface of the semiconductor chip and the substrate toward an outer edge of the substrate so that a first stress generated on a contact surface between the first resin and the semiconductor chip and a second stress generated on a contact surface between the first resin or the second resin and the substrate balance out each other.

According to yet another embodiment of the present invention, there is provided a semiconductor apparatus which includes a substrate, a semiconductor chip mounted above the substrate, a first resin filled between the substrate and the semiconductor chip, and a second resin formed on the substrate and extending from a side surface of the semiconductor chip toward an outer edge of the substrate, wherein a contact area between the second resin and the substrate is determined so that a first stress generated on a contact surface between the first resin and the semiconductor chip and a second stress generated on a contact surface between the first resin or the second resin and the substrate balance out each other.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
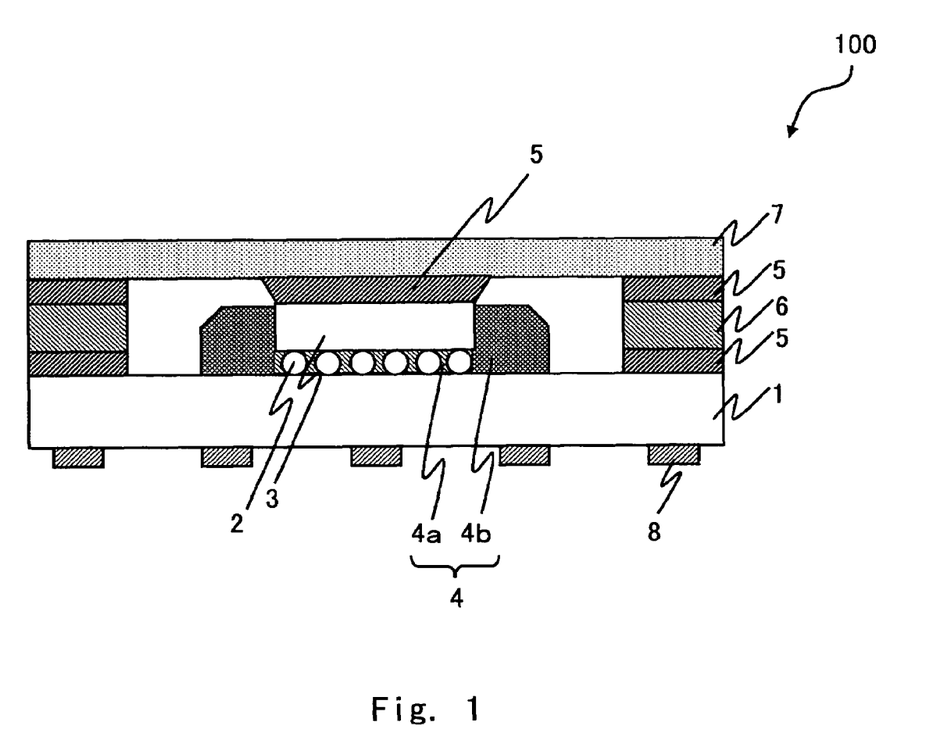
FIG. 1 is a cross sectional view of a FCBGA according to a first embodiment of the present invention.

Exemplary embodiments of the present invention are described hereinafter with reference to the drawings. FIG. 1 is a view showing a semiconductor apparatus (which is referred to hereinafter as Flip-chip BGA or FCBGA) 100 according to a first embodiment of the present invention. FIG. 1 shows the cross sectional view of the FCBGA 100. The FCBGA 100 includes a substrate 1, a solder bump 2, a semiconductor chip 3, a resin 4, a conductive adhesive resin 5, a reinforcing member 6, a covering portion 7 and a BGA ball 8. The semiconductor chip 3 is mounted above the substrate 1.

The substrate 1 is a mounting substrate having a multilayer connection structure in which a plurality of conductive layers are laminated with an insulating layer interposed therebetween. On the under surface of the substrate 1, a large number of ball pads are placed (not shown). On the ball pads, the BGA balls 8 are placed, constituting a BGA package. The BGA ball 8 is an external terminal of the FCBGA 100.

The semiconductor chip 3 is connected by flip-chip bonding at the central part of the top surface of the substrate 1. The flip-chip bonding is an electrically connecting a semiconductor chip to a substrate not by wires but by bumps (electrodes) which are two-dimensionally arrayed on the surface of the semiconductor chip. The substrate 1 and the semiconductor chip 3 are electrically connected by bumps (e.g. solder bumps 2) made of conductive material. In this embodiment, signal, power supply and ground terminals, which are formed in the circuit of the semiconductor chip 3, are electrically connected to the substrate 1 by the solder bumps 2 by way of illustration.

The resin 4 is an insulating resin such as an epoxy resin, for example. The resin 4 is injected into an area where the semiconductor chip 3 and the substrate 1 are connected by the solder bumps 2 and a particular area around the semiconductor chip 3. The resin 4 is composed of a first resin 4a and a second resin 4b. The first resin 4a is filled between the substrate 1 and the semiconductor chip 3, and it is also called "underfill". The second resin 4b is formed on the substrate 1 so as to extend from the side surface of the semiconductor chip 3 toward the outer edge of the substrate 1. The first resin 4a and the second resin 4b may be made of the same material or different materials. In this embodiment, the first resin 4a and the second resin 4b are made of the same material (resin 4) by way of illustration.

The reinforcing member 6 is fixed onto the peripheral part of the top surface of the substrate 1, with the conductive adhesive resin 5 such as a silver paste interposed therebetween, so as to surround the semiconductor chip 3. The reinforcing member 6 reduces warpage of the mounting substrate 1 due to a thermal and mechanical stress during the manufacturing process and reinforces the structural strength.

The covering portion 7 is a conductive member which is made of a copper sheet or the like, and fixed onto the surface of the semiconductor chip 3 (the upper surface in FIG. 1) which is opposite to the surface connected with the solder bumps 2 with the conductive adhesive resin 5 such as a silver paste interposed therebetween. The covering portion 7 is also fixed onto the top surface of the reinforcing member 6 with the conductive adhesive resin 5 interposed therebetween.

Figure 2A:
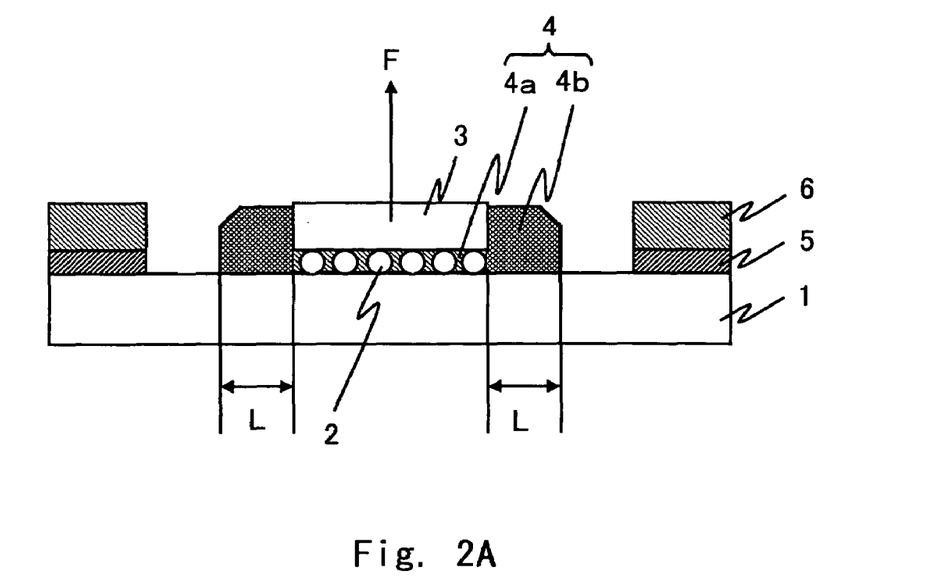
FIG. 2A is a view showing a position of a resin 4b.
Figure 2B:
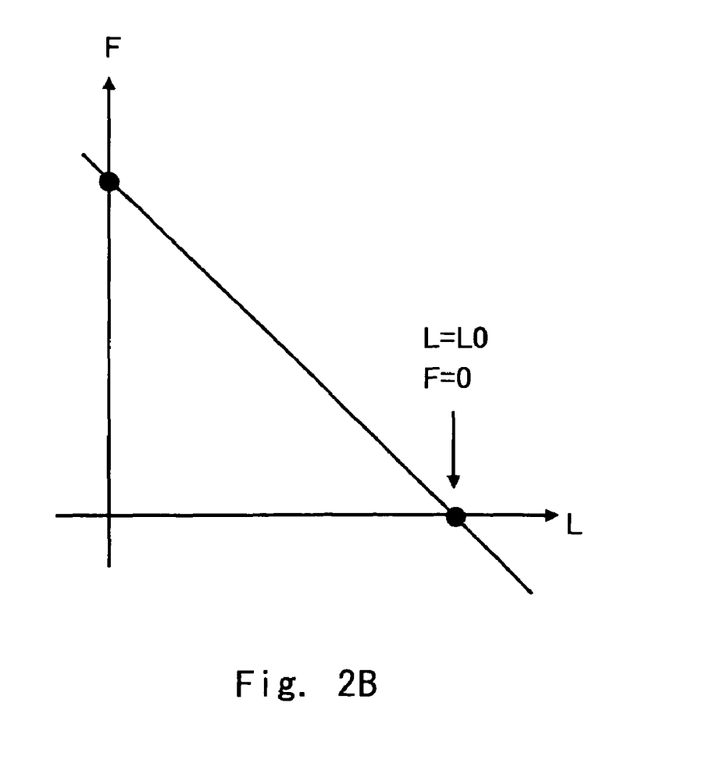
FIG. 2B is a view showing the relationship between a length L of contact between a substrate 1 and the resin 4b and a stress.
Figure 3A:
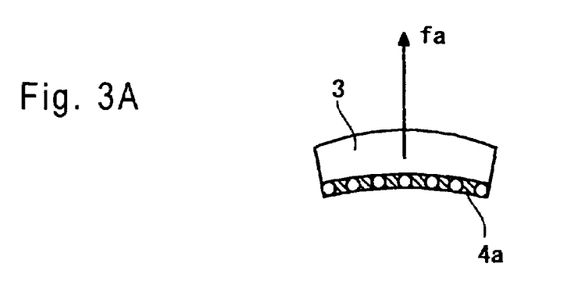
FIGS. 3A to 3C are views showing stresses applied to a semiconductor chip and a substrate where the semiconductor chip is mounted in the FCBGA according to the first embodiment.
Figure 3B:
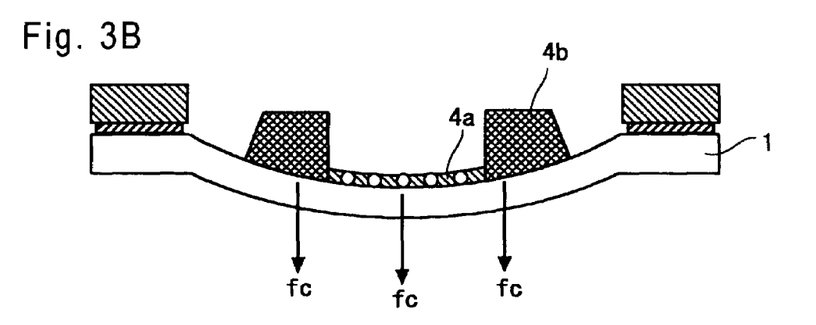
Figure 3C:
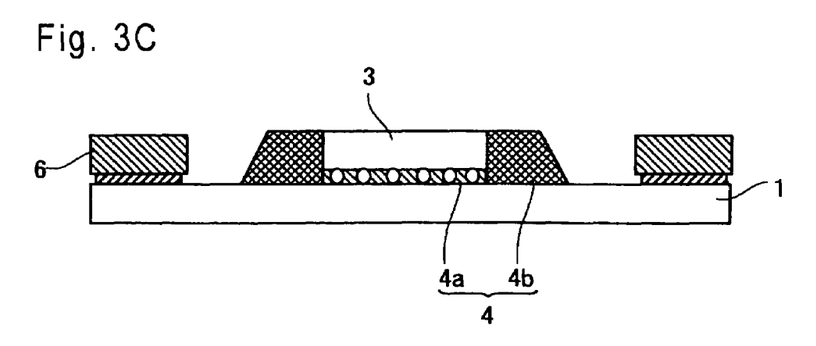

FIG. 2A is a view showing a position of the resin 4b, and FIG. 2B is a view showing the relationship between a length L of contact between the substrate 1 and the resin 4b and a stress. FIGS. 3A to 3C are views showing stresses applied to the semiconductor chip 3 and the substrate 1 where the semiconductor chip 3 is mounted in the FCBGA 100. In FIGS. 2A and 3C, the covering portion 7 and the BGA ball 8 shown in FIG. 1 are not illustrated for simplification. Referring to FIGS. 2A and 2B and FIGS. 3A to 3C, a stress F which is applied perpendicularly to the circuit surface of the semiconductor chip 3 (upward in the figures). The stress F varies based on the length L that the substrate 1 and the resin 4b are in contact with each other.

The stress F shown in FIG. 2B indicates a combined stress of a first stress (hereinafter referred to as a stress fa) and a second stress a second stress (hereinafter referred to as a stress fc). As shown in FIGS. 3A to 3C, the stress fa is generated perpendicularly to a contact surface between the circuit surface of the semiconductor chip 3 and the resin 4 (the first resin 4a). The stress fb is generated perpendicularly to a contact surface between the substrate 1 and the resin 4 (the first resin 4a and the second resin 4b) in the opposite direction to the stress fa. The length L indicates an extending length of the second resin 4b which is formed from an intersection of an extension of the side surface of the semiconductor chip 3 and the substrate surface toward the edge of the substrate 1, which is the length of a contact part between the second resin 4b and the substrate 1, as shown in FIG. 2A.

Hereinafter, the ways the stresses are applied are described in the each case. In one case, FCBGA includes the first resin 4a and the semiconductor chip 3 only (FIG. 3A) and in another case, FCBGA includes the resin 4 (4a and 4b) and the substrate 1 only (FIG. 3B).

As shown in FIG. 3A, on the contact surface between the resin 4a and the semiconductor chip 3, the stress fa is generated in the direction perpendicular to the contact surface. Due to the stress fa, the resin 4a and the semiconductor chip 3 are distorted (warped upward in this example). Then, a force for restoration (not shown) is generated in the resin 4a and the semiconductor chip 3, and distortion occurs so that the restoration force and the stress fa balance out each other.

Likewise, as shown in FIG. 3B, on the contact surface between the resin 4 (4a and 4b) and the substrate 1, the stress fc is generated in the direction perpendicular to the contact surface. Due to the stress fc, the resin 4 and the substrate 1 are distorted (warped downward in this example). Then, a force for restoration (not shown) is generated in the resin 4 and the substrate 1, and distortion occurs so that the restoration force and the stress fc balance out each other.

In the structure of this embodiment shown in FIG. 1, the combined stress F of the stress fa and the stress fc is generated. The combined stress F changes according to the length L as shown in FIG. 2B. If the length L of contact between the substrate 1 and the resin 4b is short (<L0), the stress fc on the substrate 1 is small. Accordingly, the stress fa on the semiconductor chip 3 is larger than the stress fc on the substrate 1. The combined stress F is thereby F>0, so that the FCBGA 100 is warped toward the semiconductor chip 3.

On the other hand, if the length L of contact between the substrate 1 and the resin 4b is long (>L0), the stress fc on the substrate 1 is large. Accordingly, the stress fa on the semiconductor chip 3 is smaller than the stress fc on the substrate 1. The combined stress F is thereby F<0, so that the FCBGA 100 is warped toward the undersurface of the substrate 1. There is thus a point at which the length L of contact between the substrate 1 and the resin 4b is L0, that is, the combined stress F is 0.

In view of this, in this embodiment, the resin 4b is formed so that the stress fa which is applied to the contact surface between the semiconductor chip 3 and the resin 4a and the stress fc which is applied to the contact surface between the substrate 1 and the resin 4 (4a and 4b) in the opposite direction from the stress fa balance out each other. In other words, the resin 4b is formed so that the length L that the resin 4b is in contact with the substrate 1 is L0, thereby allowing the opposite stresses fa and fc (FIGS. 3A and 3B) to cancel out each other. It is thereby possible to keep the FCBGA 100 in a flat shape in this embodiment (cf. FIG. 3C). The length L0 of contact between the substrate 1and the resin 4b shown in FIG. 2B can be calculated by simulation.

As described above, the resin 4b is formed by determining L0 so that the stress fa on the contact surface between the semiconductor chip 3 and the resin 4 and the stress fc on the contact surface between the substrate 1 and the resin 4 balance out each other. Further, the resin 4b may be formed not only so as to set the length L of contact between the substrate 1 and the resin 4b to L=L0, where the combined stress F is 0, but also so as to have a contact area between the substrate 1 and the resin 4b where the combined stress F is 0 using the contact area as a parameter.

Figure 4A:
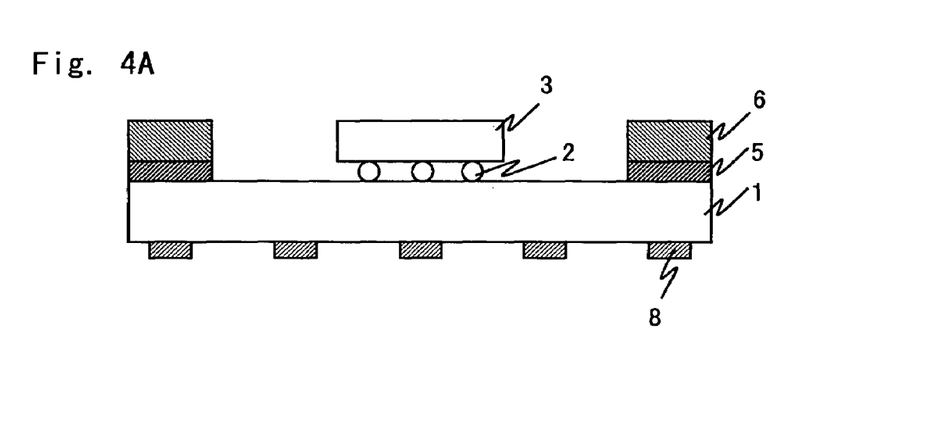
FIGS. 4A to 4C are views showing a manufacturing process of the FCBGA according to the first embodiment.
Figure 4B:
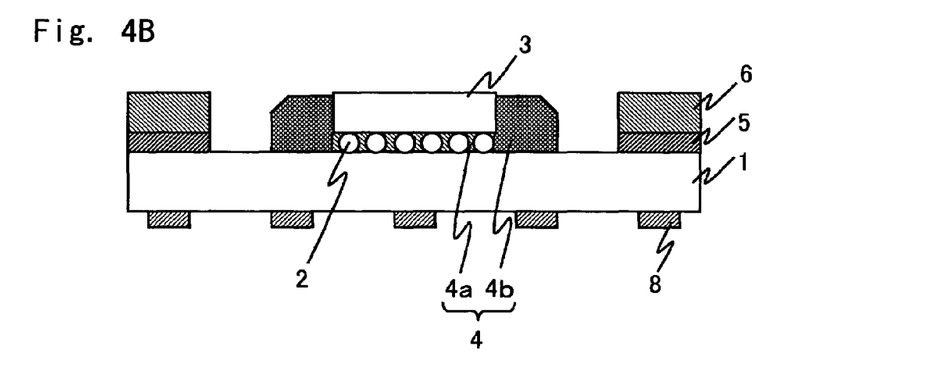
Figure 4C:
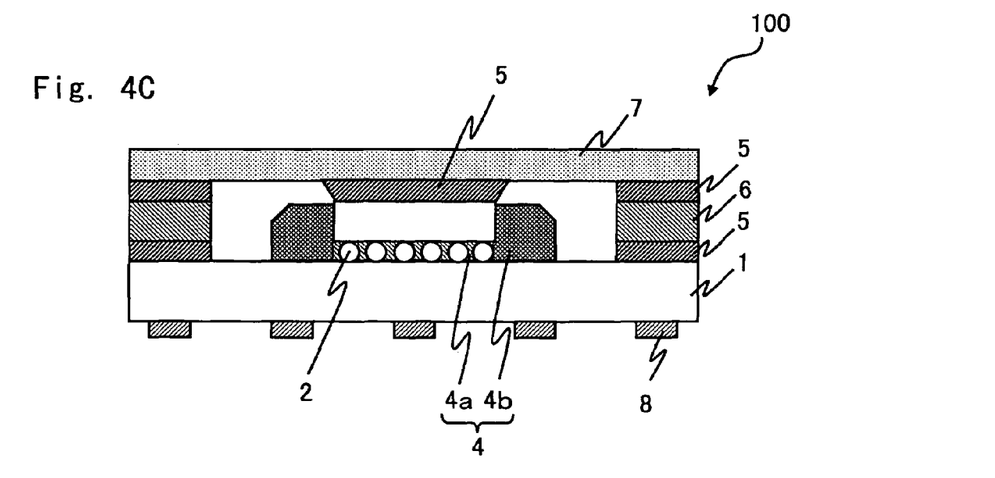

FIGS. 4A to 4C are views showing the manufacturing process of the FCBGA 100 having the above-described structure. The manufacturing process of the FCBGA 100 according to this embodiment is described hereinafter with reference to FIGS. 4A to 4C. The first resin 4a and the second resin 4b may be formed concurrently, or the second resin 4b may be formed after the first resin 4a is formed. In the following manufacturing process of the FCBGA 100 according to this embodiment, the first resin 4a and the second resin 4b are formed concurrently by way of illustration.

The substrate 1 is prepared firstly. Next, the semiconductor chip 3 is mounted above the substrate 1. The connection between the substrate 1 and the semiconductor chip 3 may be made by melting a solder paste coated on the substrate 1 under high temperature and electrically connecting the substrate 1 and the semiconductor chip 3, for example. In this manner, the semiconductor chip 3 is connected to the substrate 1 by flip-chip bonding. After the semiconductor chip 3 is mounted, the reinforcing member 6 is fixed onto the peripheral part of the top surface of the substrate 1, with the conductive adhesive resin 5 such as a silver paste interposed therebetween, so as to surround the semiconductor chip 3. Further, a large number of BGA balls 8 are placed on the surface of the substrate 1 which is opposite to the surface where the semiconductor chip 3 is mounted (FIG. 4A).

A resin is injected into an area where the semiconductor chip 3 and the substrate 1 are connected by the solder bumps 2 and a particular area around the semiconductor chip 3 on the substrate 1. At this time, the resin 4 is injected in such a way that the contact length L with the substrate 1 shown in FIG. 2B is L0, so that the stress fa on the contact surface between the semiconductor chip 3 and the resin 4 and the stress fc on the contact surface between the substrate 1 and the resin 4 balance out each other. The formation of the resin 4 may be made by using a mold described later, for example. After that, the resin 4 is hardened (FIG. 4B).

The conductive adhesive resin 5 is deposited on the semiconductor chip 3 and the reinforcing member 6. Further, the covering portion 7 is placed on the conductive adhesive resin 5 and fixed thereto (FIG. 4C). The FCBGA 100 in which the semiconductor chip 3 is connected to the substrate 1 by flip-chip bonding is thereby produced.

In the FCBGA 100 of this embodiment, the resin 4 is formed between the substrate 1 and the semiconductor chip 3 where the substrate 1 is mounted and in the vicinity of the outer edge of the semiconductor chip 3 so that the stress fa which is generated on the contact surface between the semiconductor chip 3 and the resin 4 and the stress fc which is generated on the contact surface between the substrate 1 and the resin 4 in the opposite direction from the stress fa balance out each other. The resin 4 is formed in an area such that the stress fa on the interface of the semiconductor chip 3 and the resin 4 and the stress fc on the interface of the resin 4 and the substrate 1 balance out each other. Specifically, the resin 4 is formed so that a contact part between the resin 4 extending from an intersection of an extension of the side surface of the semiconductor chip 3 and the substrate surface toward the edge of the substrate 1 and the substrate 1 has the length L0.

It is thereby possible to reduce distortion which occurs due to stresses on the semiconductor chip 3 and the substrate 1 where the semiconductor chip 3 is mounted in the FCBGA 100. This enables the FCBGA 100 to have a flat shape in this embodiment.

Further, because this embodiment reduces distortion of the FCBGA 100, it is possible to prevent damage to the solder bumps 2 which bond the substrate 1 and the semiconductor chip 3. It is also possible to prevent peel-off from occurring at a bonding interface between the solder bumps 2 and the semiconductor chip 3 or the substrate 1. It is further possible to prevent damage to the semiconductor chip 3 caused by warpage of the FCBGA 100.

The resin 4b is formed so that the sectional shape of the resin 4b is trapezoidal or rectangular when it is cut perpendicularly to the surface of the substrate 1 where the semiconductor chip 3 is mounted, on which the resin 4*b* is formed.

Second Embodiment

FIGS. 5A to 5D are views showing the manufacturing process of a FCBGA 200 according to a second embodiment of the present invention. In FIGS. 5A to 5D, the same elements as in FIG. 1 are denoted by the same reference symbols and not described in detail herein. In the first embodiment described above, the reinforcing member 6 is fixed onto the peripheral part of the top surface of the substrate 1 so as to surround the semiconductor chip 3. On the other hand, in this embodiment, the reinforcing member 6 and the covering portion 7 in the first embodiment are not placed. The illustration of the BGA ball 8 is omitted. The manufacturing process of the FCBGA 200 according to the second embodiment is described hereinafter with reference to FIGS. 5A to 5D.

First, the semiconductor chip 3 is mounted above the substrate 1 with the solder bumps 2 interposed therebetween (FIG. 5A), as in the first embodiment.

Figure 5A:
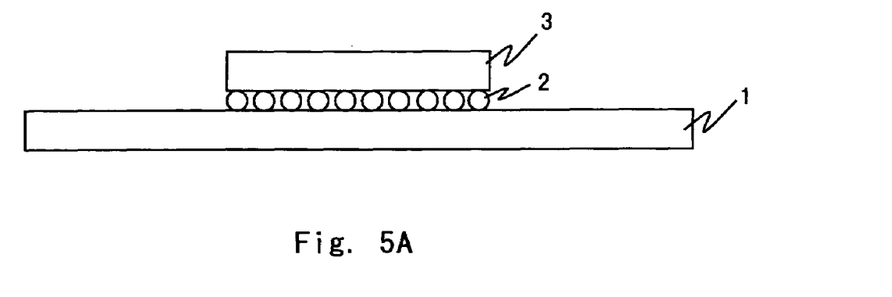
FIGS. 5A to 5D are views showing a manufacturing process of a FCBGA 200 according to a second embodiment of the present invention.
Figure 5B:
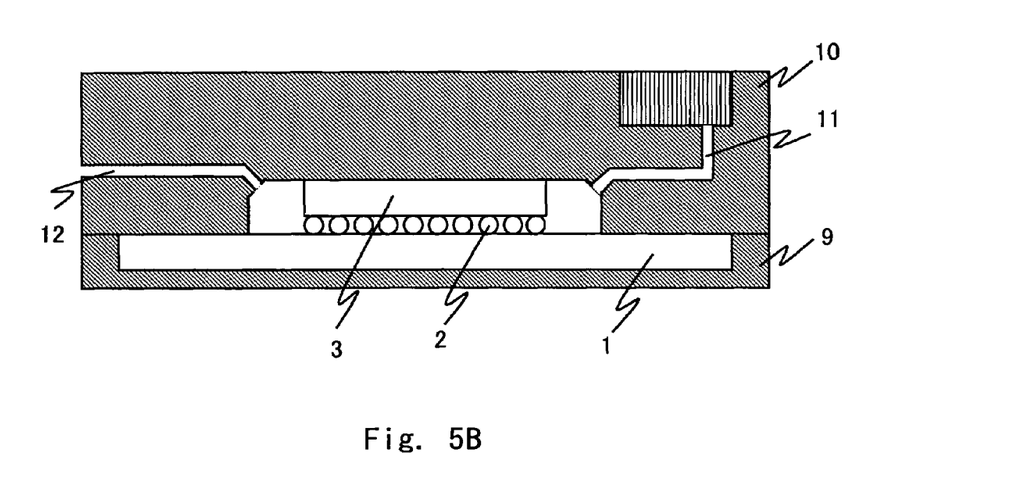

The substrate 1 where the semiconductor chip 3 is mounted as shown in FIG. 5A is placed on a first mold (which is hereinafter referred to as a mold 9). The mold 9 has a pocket of the same size as the FCBGA 200 in order to contain the FCBGA 200. A second mold (which is hereinafter referred to as a mold 10) is placed so as to fit with the mold 9 by holding down the semiconductor chip 3 and the peripheral part of the semiconductor chip 3 from above (FIG. 5B). The mold 10 has a resin inlet 11 for injecting the resin 4 and an air vent 12 serving as a hole for letting air in a resin injection region to go out.

Figure 5C:
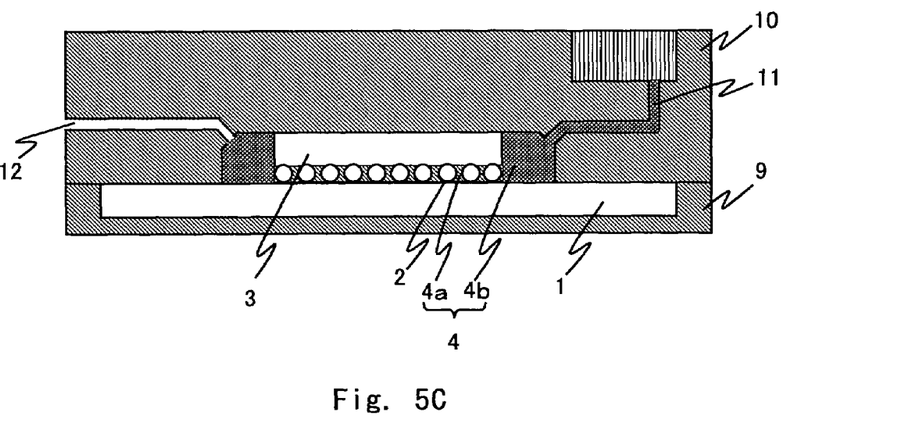

The mold 9 and the mold 10 are heated to a predetermined temperature, and the resin 4 in a liquid form is pressed into through the resin inlet 11 (FIG. 5C). The resin 4 is sealed between the solder bumps 2, which are bonded between the substrate 1 and the semiconductor chip 3, and in a given area on the substrate 1 around the semiconductor chip 3.

Figure 5D:
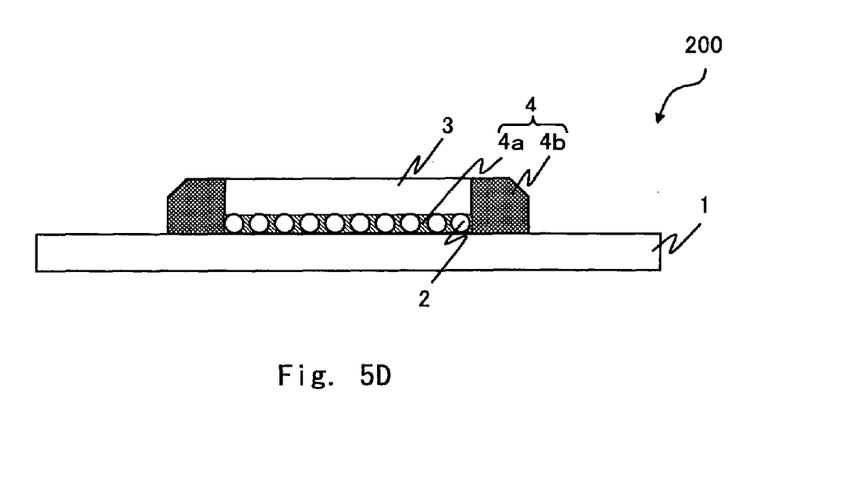

Finally, the mold 9 and the mold 10 are cooled down, and the resin 4 is thereby hardened. In the formation of the second resin 4*b*, a mold which has a cavity from the side surface of the semiconductor chip 3 toward the edge of the substrate 1 to the position in which the stress fa which is generated on the contact surface between the semiconductor chip 3 and the resin 4 and the stress fc which is generated on the contact surface between the substrate 1 and the resin 4 in the opposite direction from the stress fa are equal is placed on the substrate. Then, the mold 9 and the mold 10 are removed after the resin 4 is hardened. The resin 4 having a desired shape is thereby formed on the substrate 1 where the semiconductor chip 3 is mounted in this embodiment (FIG. 5D).

As described above, in this embodiment, the semiconductor chip 3 and the substrate 1 where the semiconductor chip 3 is mounted are placed inside the molds 9 and 10. The resin is injected between the solder bumps 2 which are bonded between the substrate 1 and the semiconductor chip 3 and in a given area in the vicinity of the semiconductor chip 3 on the substrate 1 through the resin inlet 11 of the mold 10. The resin 4 on the substrate 1 can be thereby formed into a desired shape. Further, because the resin 4 is formed into a desired shape, the stress fa which is generated on the contact surface between the semiconductor chip 3 and the resin 4 and the stress fc which is generated on the contact surface between the substrate 1 and the resin 4 in the opposite direction from the stress fa can balance out each other. It is thereby possible to reduce distortion of the semiconductor chip 3 and the substrate 1 where the semiconductor chip 3 is mounted which occurs due to stresses. This enables the FCBGA 200 to have a flat shape.

In this embodiment, injection of the resin 4 is performed after heating the mold 9 and the mold 10. However, the mold 9 and the mold 10 may be heated after injecting the resin 4.

The resin 4 is filled using the first mold and the second mold in this embodiment. However, a resin may be formed using a single mold when forming a resin by placing the substrate 1 on a conveyor belt, for example.

As described in the foregoing, according to the embodiments of the present invention, the resin is formed in a desired shape between the substrate 1 and the semiconductor chip 3 where the substrate 1 is mounted and around the outer edge of the semiconductor chip 3 so that the stress fa generated on the contact surface between the semiconductor chip 3 and the resin 4 and the stress fc generated on the contact surface between the substrate 1 and the resin 4 in the opposite direction from the stress fa balance out each other. It is possible to reduce distortion of the semiconductor chip 3 and the substrate 1 where the semiconductor chip 3 is mounted which occurs due to stresses. This enables the FCBGA 200 to have a flat shape.

Although embodiments of the present invention is described in the foregoing, the present invention is not restricted to the above-described embodiments, and various changes and modifications may be made without departing from the scope of the invention. In the above-described embodiments, reduction of the amount of warpage caused by stresses in the FCBGA is described. However, the semiconductor apparatus of the present invention is not limited to the FCBGA, and it may be any semiconductor apparatus which includes a semiconductor chip that is mounted above a substrate and a resin to cover the semiconductor chip as long as it addresses reduction of the amount of warpage caused by stresses. In such a case as well, it is possible to reduce the amount of warpage caused by stresses.

It is apparent that the present invention is not limited to the above embodiment, but may be modified and changed without departing from the scope and spirit of the invention.

What is claimed is:

1. A semiconductor apparatus comprising:
    a substrate;
    a semiconductor chip mounted above the substrate;
    a first resin filled between the substrate and the semiconductor chip; and
    a second resin formed on the substrate and extending from a side surface of the semiconductor chip toward an outer edge of the substrate, wherein
    the second resin extends from an intersection of an extension of the side surface of the semiconductor chip and the substrate toward the outer edge of the substrate so that a first stress generated on a contact surface between the first resin and the semiconductor chip and a second stress generated on a contact surface between the first resin or the second resin and the substrate balance out each other.

2. The semiconductor apparatus according to claim 1, wherein a length that the second resin is in contact with the substrate in an extending direction from the side surface of the semiconductor chip toward the outer edge of the substrate is a length that the first stress and the second stress balance out each other.

3. The semiconductor apparatus according to claim 1, wherein a sectional shape of the second resin is trapezoidal or rectangular.

4. The semiconductor apparatus according to claim 1, wherein the first resin and the second resin are made of the same material.

5. The semiconductor apparatus according to claim 1, wherein the semiconductor chip is connected to the substrate by flip-chip bonding.

6. A method of manufacturing a semiconductor apparatus, comprising:
   mounting a semiconductor chip above a substrate;
   filling a first resin between the substrate and the semiconductor chip; and
   forming a second resin extending from an intersection of an extension of a side surface of the semiconductor chip and the substrate toward an outer edge of the substrate so that a first stress generated on a contact surface between the first resin and the semiconductor chip and a second stress generated on a contact surface between the first resin or the second resin and the substrate balance out each other.

7. The method of manufacturing a semiconductor apparatus according to claim 6, wherein the second resin is formed from the side surface of the semiconductor chip toward the outer edge of the substrate so that the second resin is in contact with the substrate to a position where the first stress and the second stress are equal.

8. The method of manufacturing a semiconductor apparatus according to claim 6, wherein the formation of the second resin includes:
   placing a mold having a cavity from the side surface of the semiconductor chip toward the outer edge of the substrate to a position where the first stress and the second stress are equal on the substrate.

9. The method of manufacturing a semiconductor apparatus according to claim 6, wherein the formation of the second resin includes:
   placing the substrate where the semiconductor chip is mounted on a first mold so as to cover a part or whole of a side surface of the substrate and a bottom surface of the substrate in close contact;
   placing a second mold having a cavity for forming the second resin with a prescribed length from the side surface of the semiconductor chip toward the outer edge of the substrate above the first mold so as to cover a surface of the substrate where the semiconductor chip is mounted and the semiconductor chip; and
   injecting the second resin into the cavity through a resin inlet of the second mold.

10. The method of manufacturing a semiconductor apparatus according to claim 6, wherein the filling of the first resin is performed concurrently with the formation of the second resin.

11. A semiconductor apparatus comprising:
    a substrate;
    a semiconductor chip mounted above the substrate;
    a first resin filled between the substrate and the semiconductor chip; and
    a second resin formed on the substrate and extending from a side surface of the semiconductor chip toward an outer edge of the substrate, wherein
    a contact area between the second resin and the substrate is determined so that a first stress generated on a contact surface between the first resin and the semiconductor chip and a second stress generated on a contact surface between the first resin or the second resin and the substrate balance out each other.

12. The semiconductor apparatus according to claim 11, wherein a length that the second resin is in contact with the substrate in an extending direction from the side surface of the semiconductor chip toward the outer edge of the substrate is a length that the first stress and the second stress balance out each other.

13. The semiconductor apparatus according to claim 11, wherein a sectional shape of the second resin is trapezoidal or rectangular.

14. The semiconductor apparatus according to claim 11, wherein the first resin and the second resin are made of the same material.

15. The semiconductor apparatus according to claim 11, wherein the semiconductor chip is connected to the substrate by flip-flop bonding.

* * * * *